(12) United States Patent
Liu et al.

(10) Patent No.: US 9,285,449 B2
(45) Date of Patent: Mar. 15, 2016

(54) SYSTEMS AND METHODS FOR IMAGING AND QUANTIFYING TISSUE MAGNETISM WITH MAGNETIC RESONANCE IMAGING

(76) Inventors: Chunlei Liu, Chapel Hill, NC (US); Wei Li, Durham, NC (US); Bing Wu, Beijing (CN)

(*) Notice: Subject to any disclaimer, the term of this patent is extended or adjusted under 35 U.S.C. 154(b) by 392 days.

(21) Appl. No.: 13/517,633

(22) Filed: Jun. 14, 2012

(65) Prior Publication Data
US 2012/0321162 A1 Dec. 20, 2012

Related U.S. Application Data

(60) Provisional application No. 61/497,296, filed on Jun. 15, 2011.

(51) Int. Cl.
| | |
|---|---|
| G06K 9/00 | (2006.01) |
| G01R 33/561 | (2006.01) |
| G01R 33/44 | (2006.01) |
| G01R 33/48 | (2006.01) |
| G01R 33/565 | (2006.01) |

(52) U.S. Cl.
CPC .......... *G01R 33/5616* (2013.01); *G01R 33/443* (2013.01); *G01R 33/482* (2013.01); *G01R 33/4822* (2013.01); *G01R 33/4824* (2013.01); *G01R 33/5611* (2013.01); *G01R 33/56509* (2013.01); *G01R 33/56536* (2013.01)

(58) Field of Classification Search
None
See application file for complete search history.

(56) References Cited

U.S. PATENT DOCUMENTS

| | | | |
|---|---|---|---|
| 4,983,920 | A | 1/1991 | Lampman et al. |
| 5,406,947 | A | 4/1995 | Kimura |
| 5,539,310 | A | 7/1996 | Basser et al. |
| 6,518,757 | B1 | 2/2003 | Speier |
| 6,526,305 | B1 | 2/2003 | Mori |
| 7,319,328 | B1 | 1/2008 | Karmonik |
| 7,348,776 | B1 | 3/2008 | Aksoy et al. |
| 7,408,345 | B2 | 8/2008 | Bammer et al. |
| 7,612,561 | B2 | 11/2009 | Tatebayashi et al. |
| 2003/0212322 | A1 | 11/2003 | Haacke |
| 2003/0214289 | A1 | 11/2003 | van Muiswinkel et al. |
| 2005/0101857 | A1 | 5/2005 | Masutani et al. |
| 2006/0280689 | A1* | 12/2006 | Xiang et al. ............. 424/9.34 |

(Continued)

FOREIGN PATENT DOCUMENTS

WO WO01/38895 A1 5/2001
WO PCT/US2011/034086 A1 11/2011

(Continued)

OTHER PUBLICATIONS

Schweser, F., et al. "A novel approach for separation of background phase in SWI phase data utilizing the harmonic function mean value property." Proc of International Society of Magnetic Resonance in Medicine (2010): 142.*

(Continued)

*Primary Examiner* — Andrew Moyer
(74) *Attorney, Agent, or Firm* — Olive Law Group, PLLC

(57) ABSTRACT

Systems and methods for imaging and quantifying tissue magnetism with magnetic resonance imaging (MRI) are disclosed. According to an aspect, a method for MRI includes using an MRI system to acquire multiple image echoes of an object. The method also includes combining the image echoes. Further, the method includes generating an image of the object based on the combined image echoes for depicting a characteristic of the object.

14 Claims, 14 Drawing Sheets

(56) References Cited

U.S. PATENT DOCUMENTS

| | | |
|---|---|---|
| 2006/0281987 A1 | 12/2006 | Bartesaghi et al. |
| 2008/0008369 A1 | 1/2008 | Koptenko et al. |
| 2008/0012566 A1 | 1/2008 | Pineda et al. |
| 2008/0284434 A1 | 11/2008 | Wedeen |
| 2008/0304616 A1 | 12/2008 | Van Uitert et al. |
| 2009/0082656 A1* | 3/2009 | Bayram et al. ............. 600/410 |
| 2009/0118608 A1 | 5/2009 | Koay |
| 2009/0251140 A1* | 10/2009 | Bhardwaj et al. ........... 324/307 |
| 2009/0324046 A1 | 12/2009 | Kruger et al. |
| 2010/0010400 A1* | 1/2010 | Martin et al. ............... 601/107 |
| 2010/0079456 A1 | 4/2010 | Barth |
| 2010/0142785 A1 | 6/2010 | Dahnke et al. |
| 2011/0012595 A1 | 1/2011 | Grodzki |
| 2011/0044524 A1 | 2/2011 | Wang et al. |
| 2011/0092801 A1 | 4/2011 | Gross et al. |
| 2011/0262021 A1 | 10/2011 | Liu |
| 2012/0321162 A1 | 12/2012 | Liu et al. |

FOREIGN PATENT DOCUMENTS

| | | |
|---|---|---|
| WO | WO2011/139745 A2 | 11/2011 |
| WO | 2012174177 A2 | 12/2012 |
| WO | WO2012/174177 A2 | 12/2012 |

OTHER PUBLICATIONS

Schofield, Marvin A., and Yimei Zhu. "Fast phase unwrapping algorithm for interferometric applications." Optics letters 28.14 (2003): 1194-1196.*

Notification of Transmittal of the International Search Report and the Written Opinion of the International Searching Authority, or the Declaration, for related PCT International Application No. PCT/US2011/034086, Korean Intellectual Property Office, Nov. 11, 2011.

Notification of Transmittal of the International Search Report and the Written Opinion of the International Searching Authority, or the Declaration, for related PCT International Application No. PCT/US2012/42337, Korean Intellectual Property Office, Feb. 28, 2013.

Westin, C.-F. et al., Processing and visualization for diffusion tensor MRI, Medical Image Analysis 6 (2002) 93-108; Elsevier Science B.V. 2002.

Melhem, E. R. et al., Diffusion Tensor MR Imaging of the Brain and White Matter Tractography, AJR: 178:3-16, Jan. 2002.

Kim, Tae Hoon, International Search Report and Written Opinion mailed Jan. 28, 2014, for related international patent application No. PCT/US13/64478, Korean Intellectual Property Office, reports PCT/ISA/220 and PCT/ISA/210 and PCT/ISA/237 collectively, Jan. 28, 2014, 12 pages.

Notification of Transmittal of the International Search Report and the Written Opinion of the International Searching Authority, or the Declaration, PCT International Application No. PCT/US2011/034086, Korean Intellectual Property Office, Nov. 11, 2011.

Westin, C.-F et al., Processing and visualization for diffusion tensor MRI, Medical Image Analysis 6 (2002) 93-108; Elsevier Science B.V. 2002.

Non-final Office Action dated Nov. 23, 2012 for related U.S. Appl. No. 13/095,200, filed Apr. 27, 2011.

Applicant's Response filed Dec. 9, 2012 to Nov. 23, 2012 Non-final Office Action for related U.S. Appl. No. 13/095,200.

Final rejection dated Dec. 31, 2012 for related U.S. Appl. No. 13/095,200.

PCT Int'l Preliminary Report on patentability regarding related PCT/US2013/064478, mailed Apr. 23, 2015.

* cited by examiner

SYSTEMS AND METHODS FOR IMAGING AND QUANTIFYING TISSUE MAGNETISM WITH MAGNETIC RESONANCE IMAGING

CROSS REFERENCE TO RELATED APPLICATION

The present invention claims priority to U.S. Application Ser. No. 61/497,296, filed Jun. 15, 2011, the disclosure of which is hereby incorporated by reference in its entirety.

FEDERALLY SPONSORED RESEARCH OR DEVELOPMENT

The technology disclosed herein was made with government support under award number 4R00 EB0077182-3 awarded by National Institute of Biomedical Imaging and Bioengineering (NIBIB) of the National Institutes of Health (NIH). The United States government may have certain rights in the technology.

TECHNICAL FIELD

The presently disclosed subject matter relates to imaging. Particularly, the presently disclosed subject matter relates to systems and methods for imaging and quantifying tissue magnetism with magnetic resonance imaging (MRI).

BACKGROUND

Magnetic resonance imaging (MRI) is a non-destructive method for the analysis of materials and represents a new approach to medical imaging. It is generally non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

MRI signals for reconstructing an image of an object are obtained by placing the object in a magnetic field, applying magnetic gradients for slice selection, applying a magnetic excitation pulse to tilt nuclei spins in the desired slice or volume, and then detecting MRI signals emitted from the tilted nuclei spins while applying readout gradients. The detected signals may be envisioned as traversing lines in a Fourier transformed space (k-space) with the lines aligned and spaced parallel in Cartesian trajectories or emanating from the origin of k-space in spiral trajectories.

An MRI may be used for scanning a patient's brain or other tissue. The MRI may be useful for measuring development of the brain, particularly for scanning white-matter within the brain. White matter is a component of the central nervous system and consists of myelinated axons. MRI is the preferred reference test for diagnosing and monitoring the evolution of white-matter development and related diseases due to its excellent soft tissue contrast, high spatial resolution, and non-radioactive nature.

In typical MRI systems, phase information present in MRI images are commonly discarded except in a limited number of cases such as measuring of flow in angiography and enhancing image contrast in susceptibility weighted images. Traditionally, phase images are typically noisy and lack tissue contrast, hence these images have limited diagnostic utility. The emerging ultra-high field (7T and higher) MRI have started to reveal more interesting contrast in the phase images with improved signal-to-noise ratio (SNR). Gradient-echo MRI at 7T showed that phase contrast within gray matter exhibited characteristic layered structure. Despite these advances, one intrinsic limitation of signal phase is that phase contrast is non-local, orientation dependent, and thus not easily reproducible. Therefore, it is of great interest to determine the intrinsic property of the tissue, i.e. the magnetic susceptibility, from the measured signal phase.

The quantification of susceptibility from phase images is an ill-posed problem, since the Fourier transform of susceptibility, denoted as $\chi(k)$, cannot be accurately determined in regions near conical surfaces defined by $k^2-3k_z^2=0$. Previous approaches have been proposed to address this issue. For example, threshold techniques have been used to avoid division by zero and approximate the $\chi(k)$ values at the two conical surfaces. Although these techniques are often straightforward to implement; the accuracy, however, can be limited. Residual artifacts and noise amplification in the reconstructed susceptibility maps may hamper the visualization of subtle tissue structures, especially at ultra-high resolution. Numerical optimization relying on nonlinear regularization has shown some capability in suppressing the streaking artifacts. Typically, regularized optimization requires a careful choice of the regularization parameters. One common concern is the introduction of excessive external constraints that may cause degradation of intrinsic tissue susceptibility contrast.

For at least the aforementioned reasons, it is desired to provide improved MRI techniques for analyzing brain and other tissues.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Disclosed herein are systems and methods for imaging and quantifying tissue magnetism with MRI. More particularly, the presently disclosed subject matter provides methods for quantifying a making images of tissue magnetic susceptibility based on data acquire with MRI. In accordance with an aspect, the presently disclosed subject matter provides methods for acquiring data at high speed and resolution. In another aspect, the presently disclosed subject matter describes a mathematical relationship between magnetic susceptibility and phase. In another aspect, the presently disclosed subject matter describes an algorithm for computing magnetic susceptibility. Magnetic susceptibility maps generated in accordance with the present disclosure are of high resolution and are free of streaking artifacts. In addition, techniques disclosed herein for visualization provide a unique image contrast. In a particular example, the presently disclosed subject matter demonstrates direct application in measuring brain tissue composition of, for example, but not limited to, calcium, iron, and myelin.

According to an aspect, a method for MRI includes using an MRI system to acquire multiple image echoes of an object. The method also includes combining the image echoes. Further, the method includes generating an image of the object based on the combined image echoes for depicting a characteristic of the object.

BRIEF DESCRIPTION OF THE DRAWINGS

The foregoing summary, as well as the following detailed description of various embodiments, is better understood when read in conjunction with the appended drawings. For the purposes of illustration, there is shown in the drawings exemplary embodiments; however, the presently disclosed subject matter is not limited to the specific methods and instrumentalities disclosed.

In the drawings.

DETAILED DESCRIPTION

The presently disclosed subject matter is described with specificity to meet statutory requirements. However, the description itself is not intended to limit the scope of this patent. Rather, the inventors have contemplated that the claimed subject matter might also be embodied in other ways, to include different steps or elements similar to the ones described in this document, in conjunction with other present or future technologies. Moreover, although the term "step" may be used herein to connote different aspects of methods employed, the term should not be interpreted as implying any particular order among or between various steps herein disclosed unless and except when the order of individual steps is explicitly described. Like numbers refer to like elements throughout.

The presently disclosed subject matter provides susceptibility acquisition and mapping systems and methods that are fast and insensitive to phase wrapping. In techniques disclosed herein, the k-space may be divided into trusted regions and ill-posed regions. In the trusted regions, solutions may be obtained with direct inversion; in the ill-posed regions, two approaches may be used: one utilizing the compressed sensing technique and the other utilizing an additional derivative relationship. In numerical simulations, methods disclosed herein offer a direct inversion, which results in a near exact solution. Combining the two equations allows, for example, high quality reconstruction of susceptibility maps of human brain in vivo. The resulting maps allowed quantitative assessment of the susceptibility contrast at various anatomical structures (e.g., the iron-rich deep brain nuclei and white matter bundles) and the dependence of susceptibility on the white matter microstructures and composition.

Figure 1:
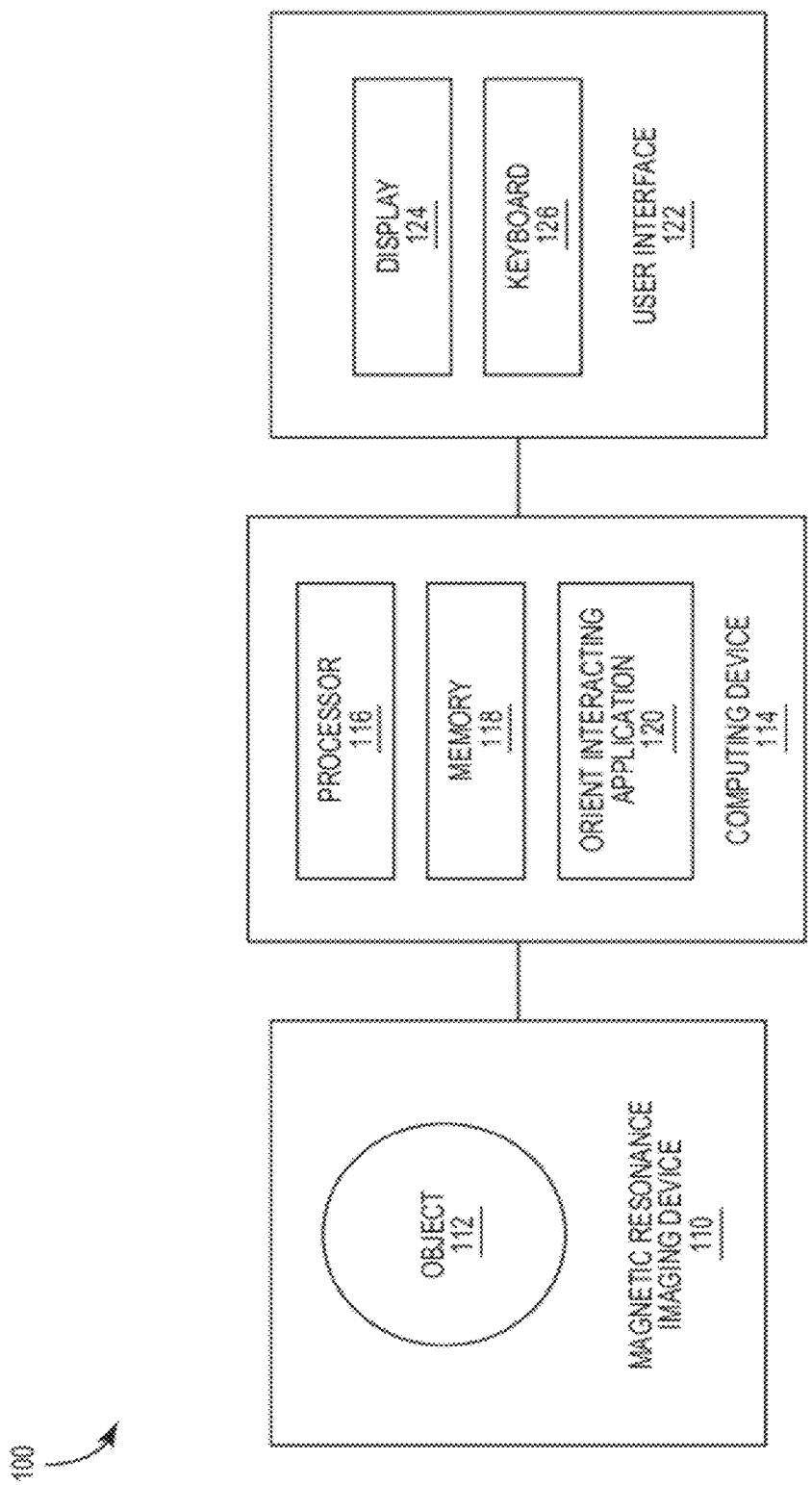
FIG. 1 is a block diagram of an MRI system in accordance with embodiments of the present disclosure.

FIG. 1 illustrates a block diagram of a magnetic resonance imaging (MRI) system 100 in accordance with embodiments of the present disclosure. Referring to FIG. 1, the system 100 may include an MRI device 110. The MRI device 110 may be configured for scanning and capturing an image of an object 112 such as an anatomical image of an object. Example objects to be imaged include, but are not limited to, brain tissue, kidney tissue, liver tissue, heart tissue, and any other bodily tissues. The MRI system 100 may include a computing device 114. The computing device 114 may include a processor 116, a memory 118, and an object interacting application 120 that is configured to execute on the processor 116. The MRI system 110 may include a user-interface 122, such as an image generator, that is configured to display images on a display 124 and to receive user input through a user input device, such as, for example, a keyboard 126.

Fourier Relationship Between Phase and Magnetic Susceptibility

A Fourier relationship between phase and magnetic susceptibility is disclosed in this section. Given a susceptibility distribution, $\chi(r)$, and the applied magnetic field, $H_0$, the resonance frequency offset, $\Delta f(r)$, can be determined using the following equation:

$$\Delta f(r) = \frac{\gamma}{2\pi} H_0 FT^{-1}\{D_2(k)FT[\chi(r)]\} \quad [1]$$

where k is the spatial frequency vector, $k=(k_x^2+k_y^2+k_z^2)^{1/2}$, $D_2(k)=(1/3-k_z^2/k^2)$. $\Delta f(r)$ can be determined from the phase offset divided by the time of echo (TE). The non-local property of phase data, and its orientation dependence is apparent from the term $D_2(k)$.

Next, $\theta(r)=2\pi f(\Delta r)/\gamma H_0$ is defined, and a Fourier transform is taken of both sides of Eq. [1]. The equation may be rewritten as:

$$\theta(k)=D_2(k)\chi(k) \quad [2]$$

Here, $\theta(k)$ and $\chi(k)$ is the Fourier transform of $\theta(r)$ and $\chi(r)$, respectively. Given the frequency shift, the susceptibility can be calculated with a direct inversion as follows:

$$\chi(k)=D_2(k)^{-1}\theta(k) \quad [3]$$

However, at the conical surface in the frequency domain defined by $D_2(k)=0$ (or $k^2-3k_z^2=0$), the inversion for susceptibility calculation is invalid. On the other hand, the forward problem of Eq. [2], which is to determine the phase distribution from a given susceptibility distribution, seems to suggest that the resulting phase distribution may lack certain frequency components defined by $k^2-3k_z^2=0$.

Susceptibility Mapping by k-Space Partitions

The k-space can be partitioned into two basic regions: a trusted region and an ill-posed region. In accordance with embodiment of the present disclosure, the trusted region may be the location in the k-space where $D_2(k) \geq \epsilon$. The ill-posed (or ill-conditioned) region may be where $D_2(k) < \epsilon$. Here, $\epsilon$ is a predetermined threshold level. Partitions may also take noise statistics into consideration. An ill-posed region may also include locations where the raw data is expected to be noisy or unreliable. In the trusted region, susceptibility can be mapped with direct inversion. In the ill-posed region, two basic techniques may be used. Technique 1, referring to as a weighted k-space derivative (WKD) method, may utilize an additional derivative relationship on top of the Fourier relationship. Technique 2 may utilize a compressed sensing (CS) methodology.

Technique 1: Susceptibility Mapping Using Weighted k-Space Partial Derivatives

To calculate the $\chi(k)$ values on the conical surfaces, the first-order derivatives of Eq. [2] in the frequency domain may be utilized. The rationale is that although $D_2(k)=0$ on the conical surfaces, its derivative is not. Utilizing the gradient field to compute $\chi(k)$ requires the spectrum of susceptibility distribution to be first-order differentiable. Such an assumption is reasonable due to the spatial continuity of brain tissues and may always be compatible with digital evaluation using Fourier transform. The resulting derivative relationship at the conical surfaces can provide an effective complement to Eq. [2] so that the zero-coefficient surface can be completely eliminated or significantly reduced.

Derivatives can be taken along any axis or combination of axes. In one or more embodiments, the first-order differentiation of Eq. [2] with respect to k is evaluated as follows:

$$\theta'(k)+[2(k_x^2+k_y^2)k_z/k^4]\cdot\chi(k)-D_2(k)\cdot\chi'(k)=0 \quad [4]$$

Here, the partial differentiations of $\theta(k)$ and $\chi(k)$ are both carried out with respect to $k_z$, which can be evaluated using Fourier transform.

Next, $D_3(k)=(k_x^2 k_y^2)+k_z/\pi k^4$ is defined, and then Eq. [4] can be rewritten as:

$$D_3(k)\cdot\chi(k)+D_2(k)\cdot FT[i\cdot r_z\chi(r)]=FT[i\cdot r_z\theta(r)] \quad [5]$$

Near the conical surfaces, $D_2(k)$ is very small, such that the term $D_2(k)\cdot FT[i\cdot r_z\chi(r)]$ is negligible. Under this condition, Eq. [5] can be reduced to:

$$D_3(k)\cdot\chi(k)\approx FT[i\cdot r_z\theta(r)] \quad [6]$$

Here, $r_z$ represents the z-axis of the image domain. Although Eq. [6] is derived directly from Eq. [2], the non-local property of differentiations eliminates the zero-coefficient scenario that exists in Eq. [2]. In addition, the magnitude of $D_3(k)$ is only large in proximity to the conical surface. Hence, the derivative relationship shown in Eq. [6] is restricted to regions on or close to the conical surface in k-space.

Combining Eq. [3] and Eq. [6], the complete solution for susceptibility mapping is given as follows:

$$\chi(k)=D_2(k)^{-1}\theta(k), \text{ when } D_2(k)\geq\epsilon \quad [7]$$

$$\chi(k)\approx D_3(k)^{-1}\cdot FT[ir_z\theta(r)], \text{ when } D_2(k)<\epsilon \quad [8]$$

Here, $\epsilon$ is a predetermined threshold level.

Once $\chi(k)$ is computed from Eqs. [7-8], the susceptibility map in the spatial domain can be calculated using an inverse Fourier transform. As a comparison, $\chi(k)$ at conical surfaces is also calculated with the "threshold" method by replacing Eq. [8] with the following approximation:

$$\chi(k)\approx\epsilon^{-1}\cdot\theta(k), \text{ when } D_2(k)<\epsilon \quad [9]$$

It is noted that the derivation of Eq. [7] and [8] is based on the assumption that the phase values within the entire field of view (FOV) are available. In simulated data, phase values can be generated for the entire FOV. For in vivo brain imaging, however, the phase outside of the brain is not available. Therefore, the lack of phase information in parts of the FOV must be taken into consideration. Hence, Eqs. [2] and [5] can be rewritten as:

$$FT[M_{brain}\cdot\theta(r)]=FT[M_{brain}D_2(k)\chi(k)] \quad [10]$$

$$M_{D_3}\cdot FT\{M_{brain}\cdot FT^{-1}\{D_3(k)\cdot\chi(k)+D_2(k)FT[ir_z\chi(r)]\}\}=M_{D_3}\cdot FT[ir_zM_{brain}\theta(r)] \quad [11]$$

Here, $M_{brain}$ is i a binary mask with ones in the tissue and zeros in the background. $M_{D_3}$ is a smooth weighting function, which is to emphasize the derivative relationship near the conical surfaces. An example form of the weighting function may be given by:

$$M_{D_3}(k)=\alpha\cdot\{[\beta-\min(\beta)]/\max(\beta)\}^3\cdot\exp[-(r_x^2+r_y^2+r_z^2)/2\cdot r_0^2], \text{ when } r_z>5$$

$$M_{D_3}(k)=0, \text{ when } r_z\leq 5 \quad [12]$$

where $r_z=N/2, \ldots, 1, 0, 1, \ldots, N/2\ 1$; $\alpha=15$, $\beta=1/(D_2(k)|0.1)$ and $r_0=48$ for $N=256$.

Eqs. [10] and [11] constitute the relationship between phase and susceptibility. Due to the presence of the brain mask $M_{brain}$, these two equations can no longer be solved through direct voxel-by-voxel inversion. Instead, we propose to solve them iteratively using the orthogonal and right triangular decomposition (LSQR) method. Prior to solving the equations, both sides of Eq. [10] were multiplied by the conjugate transpose of the coefficient matrix, i.e. $C^T\cdot C\cdot\chi(r)=C^T\cdot\theta(r)$, to improve the numerical stability. Here C is the matrix representation of relationship between phase and susceptibility as defined in Eq. [10]. For simplicity, this method is referred to as the weighted k-space derivative (WKD) method. To evaluate the effect of including the derivative relationship shown in Eq. [11], we also calculated the susceptibility map only with Eq. [10] by using the same LSQR algorithm. As a comparison, the method of using LSQR to solve Eq. [10] alone is referred to as "LSQR" method.

Technique 2: Compressed Sensing Compensated Susceptibility Estimation

In CS compensated susceptibility estimation, ill-posed k-space regions may be treated as missing data, and CS may be used to retrieve them. The extent to which the k-space regions need to be estimated can be determined by a threshold value in $D_2$. The overall susceptibility estimation can be a two-step process. In a first step, a partial k-space estimate can be obtained by performing a direct inversion using Eq. [3] up to a set threshold level. In a second step, the void in the resulting k-space dataset can be compensated using compressed sensing. Mathematically, the proposed approach can be written as:

$$\chi'(k)=\theta(k)D_2(k)^{-1} \quad [13]$$

where $\chi_k'(k)$ denotes the susceptibility estimate using direct inversion, and then $$\chi=\min_\chi\|\chi'\hbar_t\text{diag}(h_t-)W\chi\|_2+\alpha\|\Phi\chi\|_1+\beta\cdot TV(x) \quad [14]$$

where $h_t$ is a binary mask determined by the threshold level $\epsilon$, i.e.:

$$h_t = 1 \text{ when } D_2(k) > \epsilon$$
$$h_t = 0 \text{ when } D_2(k) \leq \epsilon \quad [15]$$

W is a Fourier matrix multiplication by which the Fourier transform can be produced, and diag(h) denotes a diagonal matrix with the elements of h on the diagonal. $\Phi$ is a linear transform (such as wavelet) chosen such that $\Phi\chi$ is sparse. The 1st norm $\|\Phi\chi\|_1$ promotes sparsity in $\Phi\chi$. TV($\chi$) represents the total variation (TV) constraint for mitigating rapid variation caused by error in the transform domain. The symbols $\alpha$ and $\beta$ are respective weighting coefficients.

The abovementioned approach is referred to herein as the CS compensated method, as the reconstruction in Eq. [5] is mainly focused on the missing k-space regions rather than the alternative L1 norm regularized approach, i.e.:

$$\chi' = \min_\chi \|\theta_k D_k W \chi - \|_2 \alpha \|\chi + \|_1 \beta \Phi TV(+\chi) \quad [16]$$

where the entire k-space spectrum is estimated and regularized using the transform domain based L1 norm. A drawback of this approach compared to the CS compensated method is that the entire k-space spectrum can be affected by the strong smoothing power exercised to compensate for the streaking artifacts caused by the presence of the ill-conditioned filter inversion in some k-space regions, as will be shown herein below.

Adaptive Phase-Wrap Insensitive Background Removal

To calculate the susceptibility, the Fourier transform of the phase image may be all that is needed. Here, methods are disclosed to calculate the phase image and to remove the background phase in the k-space. These methods may involve two steps and may be inherently insensitive to phase wrapping. In a first step, a Laplacian operator may be applied to the phase image that only uses the trigonometric functions of the phase. The Laplacian operator is not only insensitive to phase wraps, but also automatically removes the phase components originating from outside of the FOV, since they satisfy the Laplacian equation ($\nabla^2\theta = 0$). In a second step, background phase can be further cleaned with a sphere mean value filtering method. Specifically, for example, the Laplacian of the phase can be calculated using only cosine and sine functions of the phase as follows:

$$\nabla^2\theta = \cos\theta \nabla^2 \sin\theta \sin\theta \nabla^2 \cos\theta \quad [16]$$

This operation is intrinsically indifferent to phase wrapping. From Eq. [16], the Fourier transform of phase can be derived as follows:

$$\theta(k) = FT\{\cos\theta FT^{-1}[k^2 FT(\sin\theta)] - \sin\theta FT^{-1}[k^2 FT(\cos\theta)]\}/k^2 \quad [17]$$

Here $\theta$ includes both background phase (i.e., the coil phase and phase generated by tissue outside of region of interest) and brain local phase. The $\theta(k)$ calculated from Eq. [17] can be directly used in the subsequent background phase removal following the spherical mean value (SMV) method. Briefly, the background phase satisfied the Laplacian equation. In other words, the background phase is the harmonic phase inside the brain that is generated by susceptibility sources outside the brain. For solutions of Laplacian equation, the SMV property of Laplacian holds, i.e. the mean value of the harmonic phase on a spherical shell equals the harmonic phase at the sphere center. Therefore, the background harmonic phase can be removed using SMV filtering followed by a deconvolution operation to restore the low frequency local phase. These operations can be performed in Fourier domain with an adaptive filter width.

Multi-Echo Interleaved Image Acquisition

Figure 2:
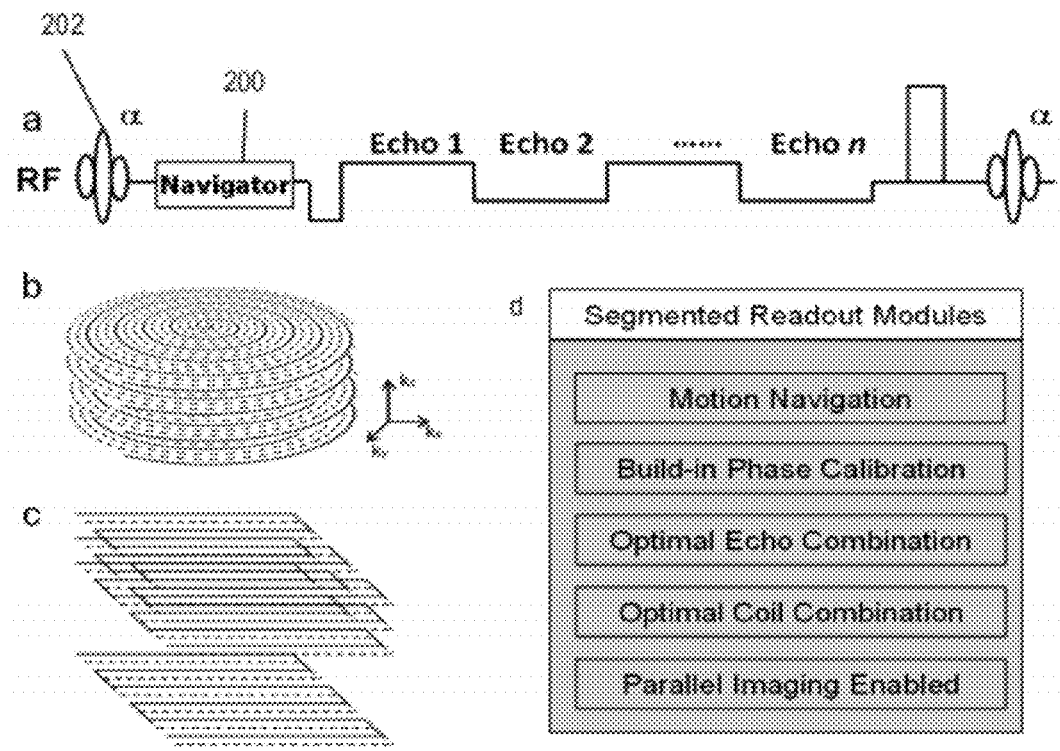
FIG. 2 depicts diagrams depicting a motion-navigated multi echo sequence for susceptibility imaging in accordance with embodiments of the present subject matter.

In accordance with embodiments of the present disclosure, three-dimensional (3D), multi-echo, multi-shot techniques are disclosed that achieve motion navigated fast image acquisition and tissue-optimized signal-to-noise ratio (SNR). FIG. 2 illustrates diagrams depicting a motion-navigated multi echo sequence for susceptibility imaging in accordance with embodiments of the present subject matter. Referring to FIG. 2a, a motion navigator 200 can be placed to follow an rf pulse 202 to take advantage of high SNR. Motion parameters can be estimated using the navigator within one TR or combining navigators from multiple TRs. These motion parameters can be used prospectively or retrospectively to correct for the motion. Prospectively, these parameters may be used to adjust the gradient system. Retrospectively, these motion parameters may be used in image reconstruction or to reject corrupted data. Image reconstruction can be performed linearly or nonlinearly in an iterative or non-iterative fashion, for example with parallel imaging or compressed sensing. This placement of navigator is efficient for phase imaging as the first echo (i.e., Echo 1) has minimal phase contrast. The subsequent image echoes (i.e., Echo 2-Echo n) can be acquired by any suitable technique. For example, the image echoes may be acquired by spin wrap, interleaved spiral (e.g., shown in FIG. 2b), segmented EPI (e.g., shown in FIG. 2c), center-out EPI or other suitable trajectories. In one or more embodiments, a segmented (multi-shot) 3D EPI trajectory can be used for each echo. To correct 3D EPI ghost artifacts, two-dimensional (2D) navigation data can be acquired, for example, at the $k_z=0$ plane with opposing readout directions. This calibration data can be acquired within a few extra TRs, which results in an insignificant additional scan time given the 3D nature of the acquisition.

FIG. 2d shows an example list of sequence and reconstruction modules that are built in image formation.

SNR of Image Phase at a Single Echo

The Rician distributed magnitude of a magnetic resonance (MR) signal may be approximated with additive white noise in the limit of high SNR. In gradient echo, the SNR of signal magnitude decays exponentially as characterized by the T2* tissue relaxation time, and hence the shortest echo time is most desirable for maximal SNR of the magnitude. However, the SNR behavior of the image phase may be less intuitive as it is non-linear and is a function of both resonance frequency and T2*. In other words, the phase behavior is tissue dependent. Knowledge of this behavior may be needed for optimizing the echo time to maximize phase SNR.

The MR signal M at time t may be written as:

$$M = M_0 e^{-\frac{t}{T2^*}} e^{-i2\pi f t} + n = \quad [18]$$
$$M_0 e^{-\frac{t}{T2^*}} \cos(2\pi f t) - i M_0 e^{-\frac{t}{T2^*}} \sin(2\pi f t) + n_{re} - i n_{im}$$

where $n_{re}$ and $n_{im}$ represents white noise in real and imaginary parts with the same noise power, $M_0$ is the transverse magnetization, i is the imaginary unit and f is the frequency offset. It can be shown that the noise in signal phase, $n_\theta$, in a first-order approximation, may be written as:

$$n_\theta = \frac{1}{M_0 e^{-\frac{t}{T2^*}}} n_{im} \cos(2\pi f t) - i \frac{1}{M_0 e^{-\frac{t}{T2^*}}} n_{re} \sin(2\pi f t) \quad [19]$$

If the real and imaginary channel has equal noise variance, i.e. if $\sigma_{re}^2 = \sigma_{im}^2 \sigma^2 =$, the noise power in the $$\sigma_\theta^2 = \left(\frac{1}{M_0 e^{-\frac{t}{T2^*}}}\sigma\right)^2 \quad [20]$$

Then the SNR of the image phase at time t may be written as:

$$SNR_\theta = \frac{2\pi f t}{\sigma_\theta} = \frac{2\pi f t M_0 e^{-\frac{t}{T_2^*}}}{\sigma} \quad [21]$$

It shows that the SNR of the image phase is dependent on the frequency offset source, the transverse magnetization, and the T2* tissue relaxation time. It is then easy to derive the echo time at which the $$\frac{dSNR_\theta}{dt} = 0 \Rightarrow t = t_2^* \quad [22]$$

The image phase reaches its maximal SNR when the echo time is equal to T2* (FIG. 2).

Tissue-Optimized SNR by Combining Multiple Echoes and Multiple Coils

Assuming that the noise levels in the phase images acquired with different echo times are temporally uncorrelated, algebraic averaging can improve the SNR level. Direct averaging of the frequencies at N echoes leads to a SNR of:

$$SNR_{ME} = \frac{2\pi f}{\sqrt{\sum_{n=1}^{N}\frac{1}{(M_{t_n} t_n)^2}}\sigma} \quad [23]$$

where $t_n$ denotes the n-th TE out of the N echoes, and $$M_{t_n} = M_0 e^{-\frac{t}{T_2^*}}$$

denotes the signal magnitude at $t_n$. An example technique for combining the frequencies measured at different TE is to weigh the frequencies with their respective SNR prior to the combination, similar to that used in fMRI. Specifically, the frequency map at echo time $t_n$ may be weighted by:

$$W_n = \frac{t_n e^{-\frac{t}{T_2^*}}}{\sum_{n=1}^{N} t_n e^{-\frac{t_n}{T_2^*}}} \quad [24]$$

In this way, the SNR of the weighted combination is given as:

$$SNR_{MEW} = \frac{\sum_{n=1}^{N} M_{t_n} t_n 2\pi f}{\sqrt{n}\,\delta} \quad [25]$$

The two aforementioned techniques of calculating resonance frequency may be referred to as multi-echo (ME) averaging and multi-echo weighted (MEW) averaging respectively.

Calculating the SNR of multi-echo weighted frequency may require knowledge of $M_0$, f and T2*. It can be informative to calculate the SNR ratios when comparing the two SNRs. The ratios of the SNR gains from multi-echo acquisition may be, for example:

$$\frac{SNR_{ME}}{SNR_{t_2^*}} = \frac{N}{0.37 t_2^* \sqrt{\sum_{n=1}^{N}\frac{1}{\left(t_n e^{-\frac{t_n}{t_2^*}}\right)^2}}} \quad [26]$$

$$\frac{SNR_{MEW}}{SNR_{t_2^*}} = \frac{\sum_{n=1}^{N} t_n e^{-\frac{t_n}{t_2^*}}}{0.37\sqrt{N}\, t_2^*} \quad [27]$$

In Eqs. [26] and [27], only the T2* of the tissues may be needed for calculating SNR gains. For a T2* of 30 milliseconds (ms), the theoretical SNR gains by combining the frequency maps at 10 ms, 20 ms, 30 ms, 40 ms and 50 ms are 1.88 and 1.96 respectively for multi-echo averaging and multi-echo weighted averaging. These gains are approximately equivalent to the SNR gain that can be obtained from averaging 4 acquisitions (a gain of 2).

Figure 3:
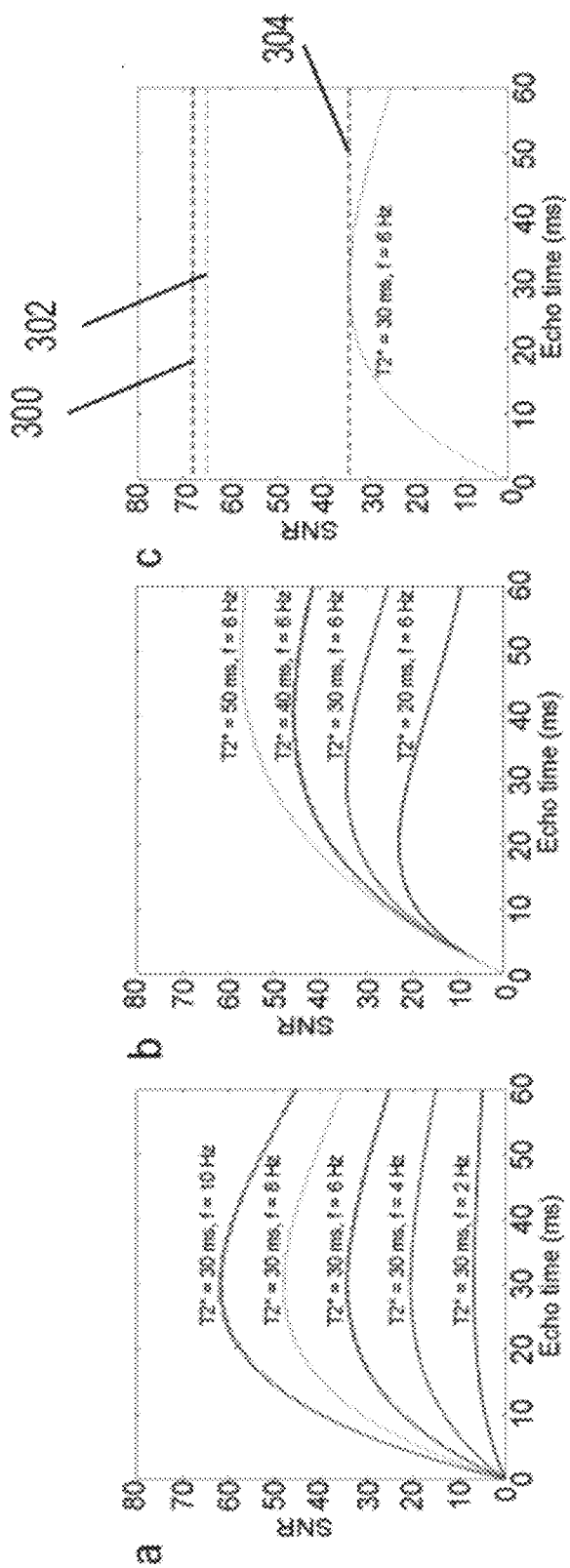
FIG. 3 are graphs of simulation results showing the behavior of phase SNR.

FIG. 3 illustrates graphs of simulation results showing the behavior of phase SNR. Particularly, FIG. 3a shows phase SNR as a function of the echo time at different frequency offsets (2 Hz to 10 Hz in a step of 2 Hz). FIG. 3b shows phase SNR as a function of the echo time for different T2* times (20 ms to 50 ms in a step of 10 ms). FIG. 3c shows a comparison of phase SNR of multi-echo (ME) averaging, multi-echo weighted (MEW) averaging (echo times: 10, 20, 30, 40 and 50 ms) and a single echo at the T2* (30 ms). MEW achieves the maximal SNR. In FIG. 3c, MEW is referenced by reference numeral 300, ME is referenced by reference numeral 302, and SE at T2* is referenced by reference numeral 302.

When multiple coils are used, each coil adds to the image a coil specific phase that is associated with the coil sensitivity. In an example, several steps may be taken to combine phase maps from multiple coils. In a first step, the phase may be unwrapped from each coil with the Laplacian operator or other suitable techniques. In a second step, a reference phase may be chosen, for example, the mean of phases from all coils. In a third step, the phase difference between coils may be removed. In a fourth step, the resulting phases may be combined with the magnitude of corresponding coil images to form a complex image for each coil. In a fifth step, all complex images may be added together to calculate the resulting phase. The procedure of combining multiple coils can be interchanged with the procedure of combining multiple echoes. The procedure may also be used to combine original phase without unwrapping. Magnitude may be used in a linear or nonlinear weighting function.

Figure 4:
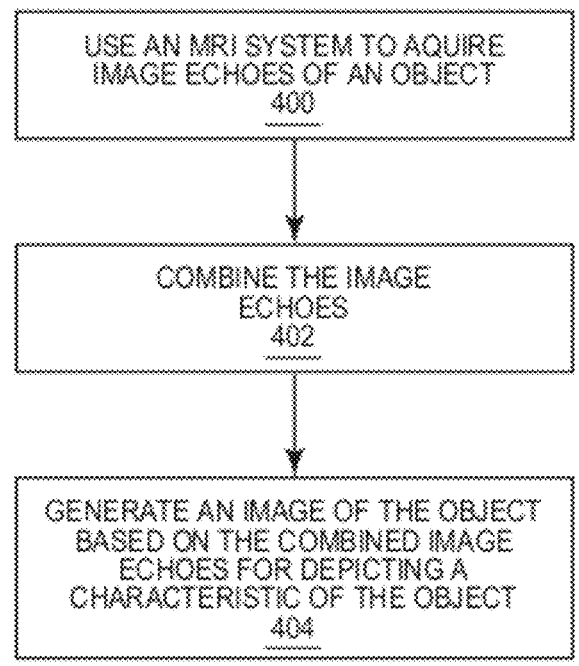
FIG. 4 is a flowchart of an example method for MRI in accordance with embodiments of the present disclosure.

FIG. 4 illustrates a flowchart of an example method for MRI in accordance with embodiments of the present disclosure. The method of FIG. 4 is described as being implemented by the MRI system 100 shown in FIG. 1; however, this example method should not be considered so limiting as the method may be applied to any suitable MRI system or other imaging system.

Referring to FIG. 4, the method includes using an MRI system to acquire image echoes of an object (step 400). For example, the MRI system 100 shown in FIG. 1 may be used to acquire image echoes of the object 112. The object 112 may be brain tissue or any other bodily tissue. The MRI system 100 may apply a magnetic field to the object 112. The imaging data may be acquired at multiple data points, including, for example, acquiring imaging data of the object 112 at multiple orientations of the object 112 relative to a magnetic field generated by the MRI system 100. Further, the imaging data may be acquired continuously. The MRI system 100 may acquire image echoes by any suitable technique such as, but not limited to, spin wrap, interleaved spiral, and segmented EPI trajectories.

The method of FIG. 4 includes combining the image echoes (step 402). For example, the image echoes may be combined by applying a suitable technique such as, but not limited to, echo averaging and multi-echo weighted averaging to the image echoes. The computing device 114 may be configured to implement this example step.

The method of FIG. 4 includes generating an image of the object based on the combined image echoes for depicting a characteristic of the object. The characteristic may be, for example, iron rich regions, including regions containing red nucleus (RN) and substantia nigra (SN), and those containing the globus pallidus (GP) and putamen (PU). The computing device 114 may be configured to implement this example step.

Adaptive Phase-Wrap Insensitive Background Phase Removal

Figure 5:
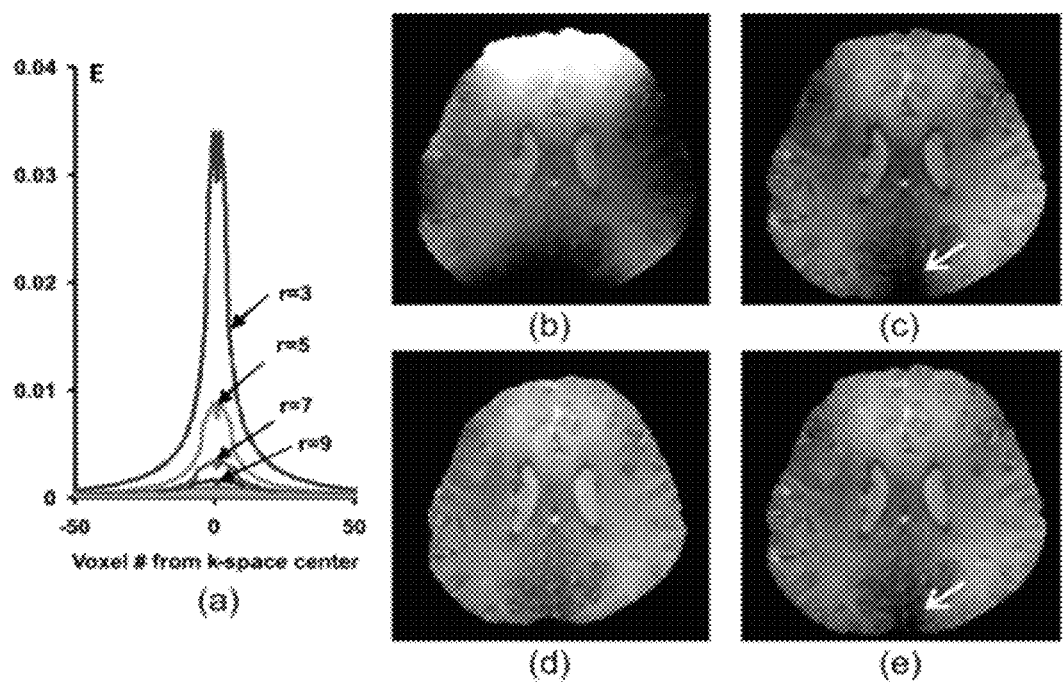
FIG. 5 depicts a graph and images showing effects of using different sphere diameters in spherical mean value (SMV) background phase removal.

FIG. 5 illustrates a graph and images showing effects of using different sphere diameters in spherical mean value (SMV) background phase removal. Particularly, FIG. 5a is a graph showing the cross-section of the deconvolution kernels for different diameters r. FIG. 5b is an example image of an original unwrapped phase map. FIG. 5c is an example image showing background phase removal using a sphere filter of 3 voxels in diameter. FIG. 5d is an example image showing background phase removal with a sphere filter 8 voxels in diameter. FIG. 5e is an example image showing background phase removal with an adaptive sphere filter varying from 8 to 3 voxels in diameter. A small sphere diameter causes large error amplification (pointed by arrows in FIG. 5a), whereas a large diameter causes larger regions at the boundary to be discarded. A small diameter of the sphere filter corresponds to a deconvolution kernel with large magnitude, and vice versa (as shown in the example of FIG. 5a). As a result, using a sphere filter with a small diameter may cause large amplification of the residual phase error as illustrated in FIG. 5c where a radius of 3 was used. On the other hand, using a radius of 9 led to a much lower level of phase error as seen in FIG. 5d. However, the apparent drawback of using a large sphere diameter is the fact that there would be larger number of invalid points at the boundary that need to be discarded. Hence, the selection of different sphere diameters presents a trade-off between the residual background phase and the integrity of the resulting phase map.

In accordance with embodiments of the present disclosure, a varying diameter scheme may be used to achieve a better compromise between the two (see FIG. 5e). In the convolution process, a large diameter may be used as long as no invalid point is produced, and as it approaches the boundary of the region-of-support, the diameter of the sphere filter is gradually reduced so that the number of resulting invalid points is minimized. In the deconvolution process, the convolution kernel corresponding to the largest diameter used is employed. In this way, both low phase error and the integrity of the phase map are achieved.

Figure 6:
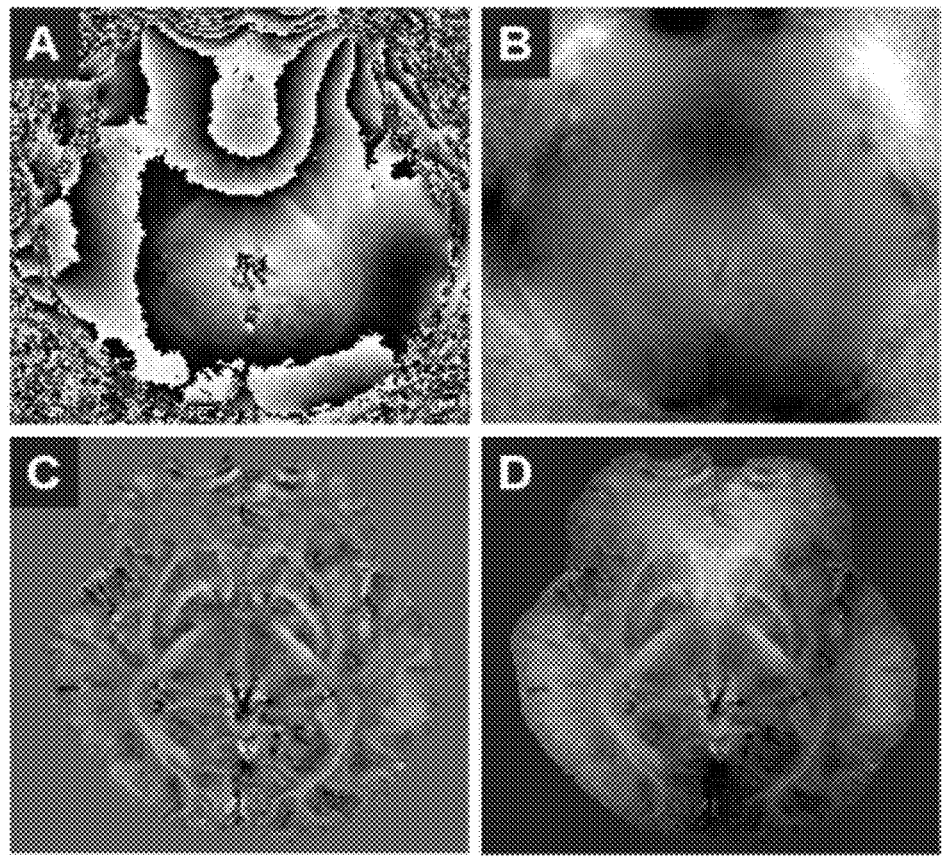
FIG. 6 are images depicting phase wrap insensitive background removal.

FIG. 6 illustrates images depicting phase wrap insensitive background removal. Particularly, FIG. 6A shows an original phase image from which the Fourier transform of the phase image was calculated. FIG. 6B shows an image resulting from a Laplacian unwrapped phase followed by an inverse Fourier transform. A simple inverse Fourier transform allowed the visualization of the unwrapped phase for the image of FIG. 6B. The resulting unwrapped phase is continuous, even at the tissue air boundary, demonstrating the excellent robustness. The background phase was then filtered with the spherical mean value to result in the SMV filtered phase image of FIG. 6C. It is noted that some of the local phase is also removed along with the harmonic background phase. Hence, the SMV filtered image was further deconvolved to restore the local phase as shown in the image of FIG. 6D. The resultant local phase images can then be converted to local frequency map for subsequent susceptibility reconstruction.

WKD Method: Susceptibility Mapping in the Numerical Phantom

Figure 7:
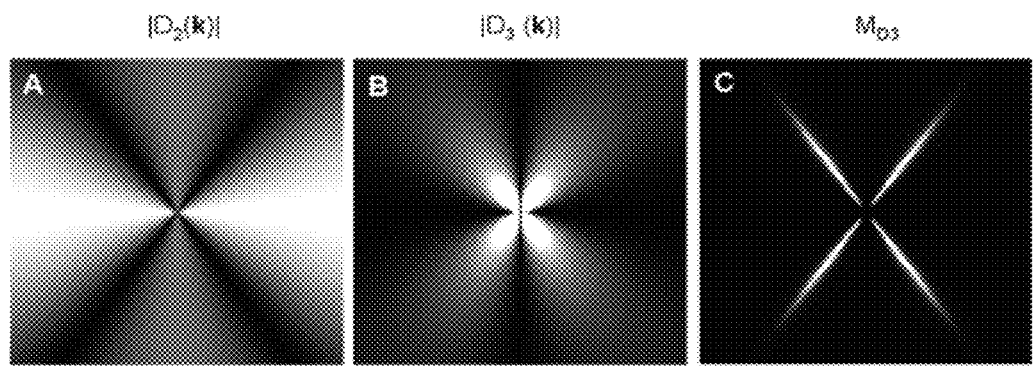
FIG. 7 are images of the magnitude of $D_2(k)$, $D_3(k)$, and $M_{D3}$ used in a WKD method.

In an experiment, a 3D 128×128×128 Shepp-Logan phantom was generated to evaluate the accuracy of susceptibility mapping. The phantom was composed of multiple ellipsoids placed in a homogenous background with zero susceptibility. The susceptibility values for the ellipsoids were 0, 0.2, 0.3 and 1 ppm, respectively. To minimize Gibbs ringing, the phantom was further zero padded to 256×256×256 for accurate simulation of the corresponding resonance frequency map. The quantification of susceptibility involves $D_2(k)$, $D_3(k)$ and $M_{D3}$. FIG. 7 illustrates images of the magnitude of $D_2(k)$ (FIG. 7A), $D_3(k)$ (FIG. 7B) and $M_{D3}$ (FIG. 7C) used in the WKD method. Referring to FIG. 7A, the magnitude of $D_2(k)$ shows the zero-coefficient cone as defined by $k^2-3k_z^2=0$, while such zero-coefficient cone is not present in the magnitude of $D_3(k)$ (FIG. 7B). These results demonstrate that the original equation and its first order derivatives is complementary. The continuous mask for derivative operation ($M_{D3}$) is shown in FIG. 7C.

Figure 8:
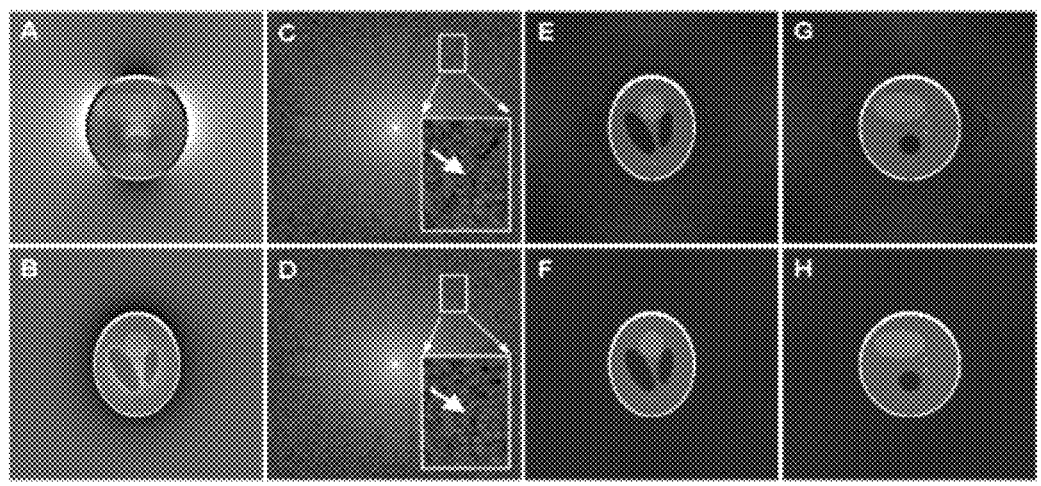
FIG. 8 depicts graphs showing an example susceptibility mapping of a 3D Shepp-Logan phantom.

FIG. 8 illustrates graphs showing an example susceptibility mapping of a 3D Shepp-Logan phantom. Particularly, FIG. 8A shows the phase image simulated using the Shepp-Logan phantom with the bipolar patterns around the phantom in the X-Z (and Y-Z, not shown) plane. Such bipolar pattern is not present in the X-Y plane, which is perpendicular to the main magnetic field that is along the Z-axis, which is shown in FIG. 8B.

FIG. 8C shows a $\chi(k)$ image calculated by the threshold. FIG. 8D shows an image of the WKD method in the X-Z plane. The spectrum of the susceptibility, $\chi(k)$, was calculated from the simulated phase images using two methods: the threshold method and the WKD method. The threshold method yielded discontinuous $\chi(k)$ at the conical surfaces (FIG. 8C), indicating inaccurate results. Such discontinuities were absent using the WKD method (FIG. 8D). $\chi(k)$ is displayed as $\log_{10}(|\chi(k)|)$. The arrow in FIG. 8C indicates the discontinuous $\chi(k)$ values. Such discontinuity is virtually absent in FIG. 8D.

Accordingly, the streaking artifact was obvious using the threshold method (FIGS. 8E and 8G), while it was not visible using the WKD method (FIGS. 8F and 8H). FIG. 8E shows a susceptibility map calculated by the threshold. FIG. 8F shows an image resulting from the WKD method in the X-Y plane. FIG. 8G shows a susceptibility map calculated by the threshold. FIG. 8H shows an image resulting from the WKD method in the X-Z plane.

WKD Method: Quantitative Susceptibility Mapping of Human Brain

Figure 9:
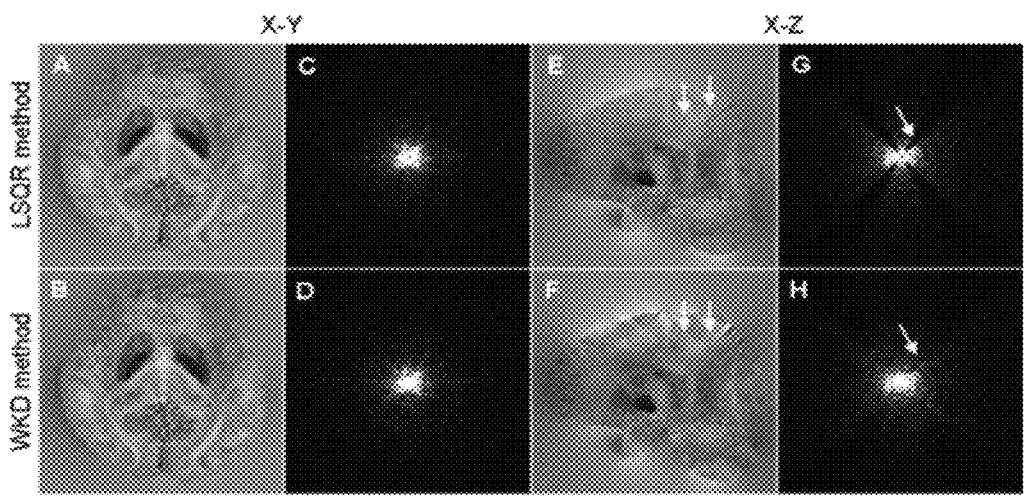
FIG. 9 depicts images providing a comparison of WKD and LSQR methods for susceptibility mapping.

In an experiment, in vivo brain imaging of healthy adult volunteers was conducted on a GE MR750 3.0T scanner (available from GE Healthcare, of Waukesha, Wis.) equipped with an 8-channel head coil. FIG. 9 illustrates images providing a comparison of WKD and LSQR methods for susceptibility mapping. The LSQR method already yields good-quality susceptibility maps without noticeable streaking artifacts as shown in FIGS. 9A and 9B, which show images of a susceptibility map in the X-Y plane by LSQR and WKD methods, respectively. FIGS. 9C and 9D show images of $\chi_1(k)$ corresponding to the images in FIGS. 9A and 9B, respectively. FIGS. 9E and 9F show images of the susceptibility map in the X-Z plane by LSQR and WKD methods, respectively.

FIGS. 9G and 9H show images of the Fourier of the images of FIGS. 9E and 9F, respectively. The imperfection of the LSQR method is visible in k-space as evidenced by the reduced amplitude along the conical surfaces as shown FIG. 9G and pointed by the arrow. In contrast, the discontinuity in $\chi(k)$ is significantly reduced using the WKD method as shown in FIG. 9H. Similar to the LSQR method, the WKD method determined susceptibility is also streaking artifact free as shown in FIGS. 9B and 9F, while the corresponding local susceptibility seems to show more contrast than the LSQR method as shown in FIG. 9F and indicated by the arrows.

Figure 10:
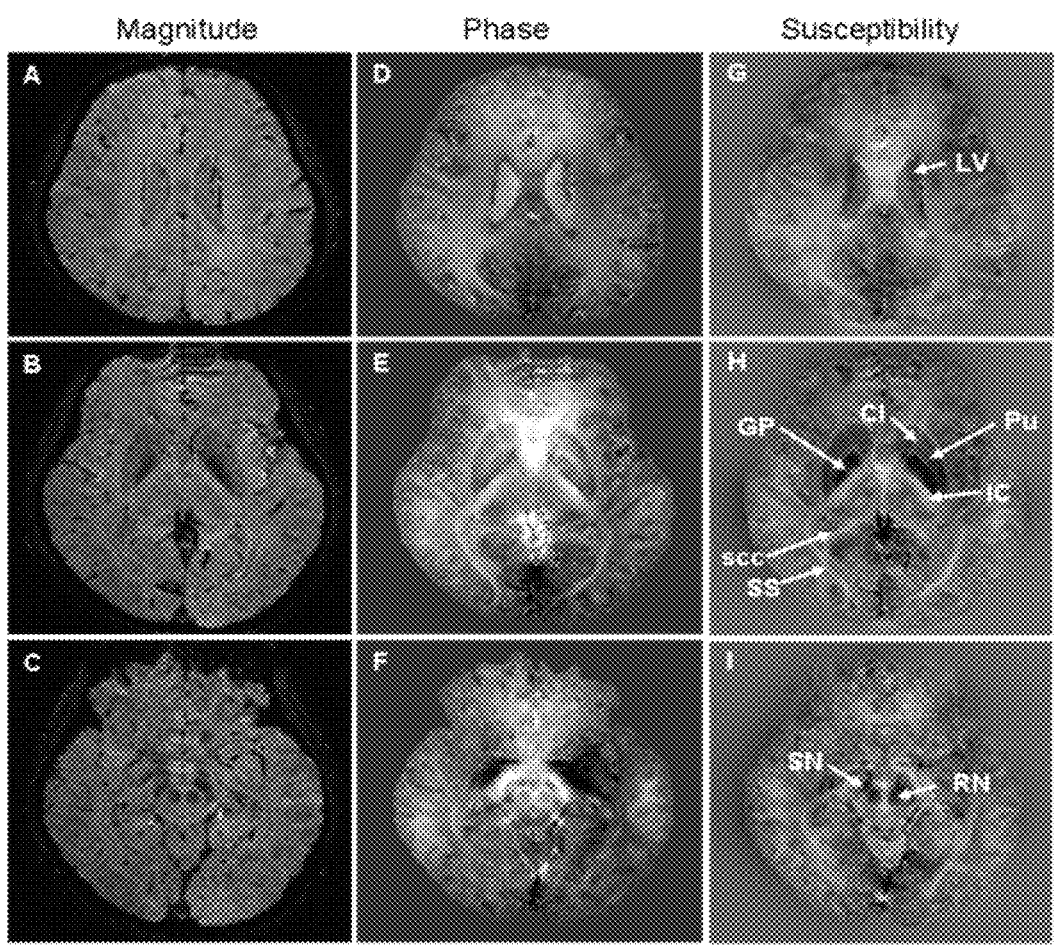
FIG. 10 depicts illustrates images of an example magnitude, phase and susceptibility contrast in an axial view of a brain.

Additional examples are shown in FIG. 10, which illustrates images of an example magnitude, phase and susceptibility contrast in an axial view of a brain. Particularly, FIGS. 10A-10C shows magnitude images of the brain from different axial views. FIGS. 10D-10F show phase images at the same locations as those in FIGS. 10A-10C, respectively. FIGS. 10G-10I show susceptibility images at the same locations as those in FIGS. 10A-10C, respectively. Text overlaying the images of FIG. 10 are defined as follows: GP—globus pallitus; Pu—putamen; CI—capsula interna; RN—red nucleus; SS—sagittal stratum; scc—splenium of the corpus collosum; and SN—substantia nigra.

CS-Compensated Method

Figure 11:
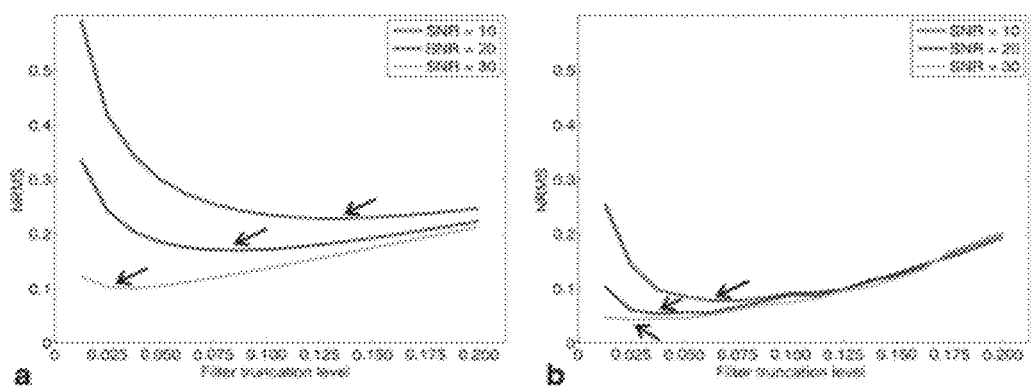
FIGS. 11A and 11B are L-curve plots of the NRMS of reconstructed susceptibility maps.

An example comparison of the calculated normalized root mean square (NRMS) at different noise levels for truncation levels ranging from 0.0125 to 0.2 are shown in FIGS. 11A and 11B, which illustrate L-curve plots of the NRMS of reconstructed susceptibility maps using: (a) the direct threshold method and (b) the compressed sensing compensated method against the different filter truncation levels at varying SNR levels. The arrows point to the turning points on the L-curve plots. Regardless of the SNR, the CS-compensated reconstruction features a considerably lower level of NRMS than the direct threshold. A common feature to all the plots is a turning point (as indicated by the arrows) where the NRMS variation transitions from decreasing to increasing as the filter truncation level rises. The error to the left of the minimum is dominated by noise so the overall NRMS drops as the truncation level increases whereas, to the right of this minimum, further increasing the truncation level leads to the loss of image information. This loss of information causes the NRMS to increase. In general, it is observed in both methods that as the SNR level improves the turning point shifts to a lower truncation level. Also, CS-compensated reconstruction features a turning point at a much lower truncation level than the thresholded inversion method, which means that it is possible to trade off a smaller amount of image information in order to achieve a lower level of artifacts. Realistically, for an SNR level of 20, the turning point for the direct threshold and CS-compensated methods are 0.075 and 0.0375, respectively.

Figure 12:
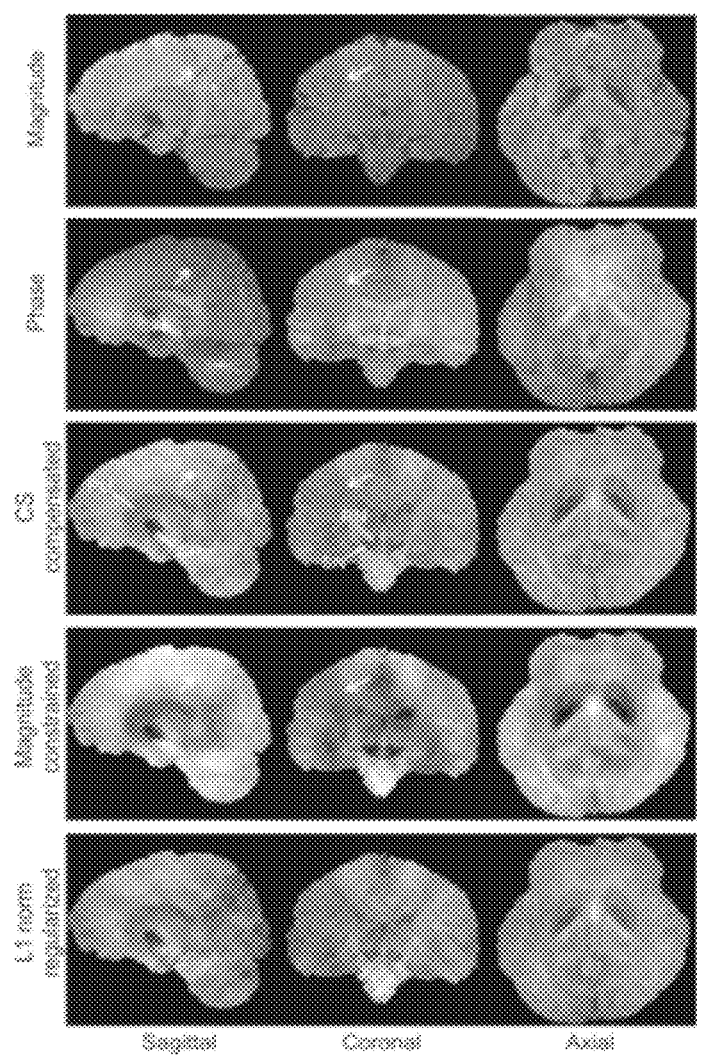
FIG. 12 depicts images that provide a comparison of susceptibility maps calculated using the CS compensated method, the L1 norm regularized method and the magnitude gradient constrained method.

FIG. 12 illustrates images that provide a comparison of susceptibility maps calculated using the CS compensated method, the L1 norm regularized method and the magnitude gradient constrained method. Particularly, a comparison of the image magnitude is shown in the top row, a comparison of phase maps is shown in the second row, and a comparison of calculated susceptibility maps using different methods at three orthogonal planes is shown in the other rows. Susceptibility maps are calculated using the CS compensated method in the third row, magnitude gradient regularized method in the fourth row, and L1 norm regularized method in the bottom row. The susceptibility maps obtained using the CS compensated method feature better contrast at the WM/GM cortex interfaces as pointed to by the solid arrows. It is noted that dark regions indicate paramagnetic (more positive) and bright regions indicate diamagnetic (more negative).

In the CS compensated method, a threshold level of 0.0625 was used. It is seen that the image magnitude shows poor contrast in the gray/white matter interface in the cortical regions compared to the image phase map. The phase map, however, has difficulty delineating iron rich regions due to its non-local property, including regions containing red nucleus and substantia nigra, and those containing the globus pallidus and putamen. On the contrary, good contrast and clear delineations of these regions are seen in the susceptibility maps calculated using the CS compensated method. The susceptibility map calculated using the L1 norm regularized method still shows residual streaking artifacts despite the apparent smoothing appearance, due to the reason discussed previously. The magnitude image regularized susceptibility map shows a considerably reduced level of streaking artifacts due to the spatial gradient regularization. However, this magnitude image seems to feature a lack of contrast in regions with low susceptibility variations (i.e. the grey/white matter interfaces at the cortex) compared to the susceptibility map obtained using the CS compensated method, most likely because the magnitude image used as an a priori estimate has a lack of contrast in those regions (as indicated by arrows).

Multi-Echo Interleaved Phase Acquisition

Figure 13:
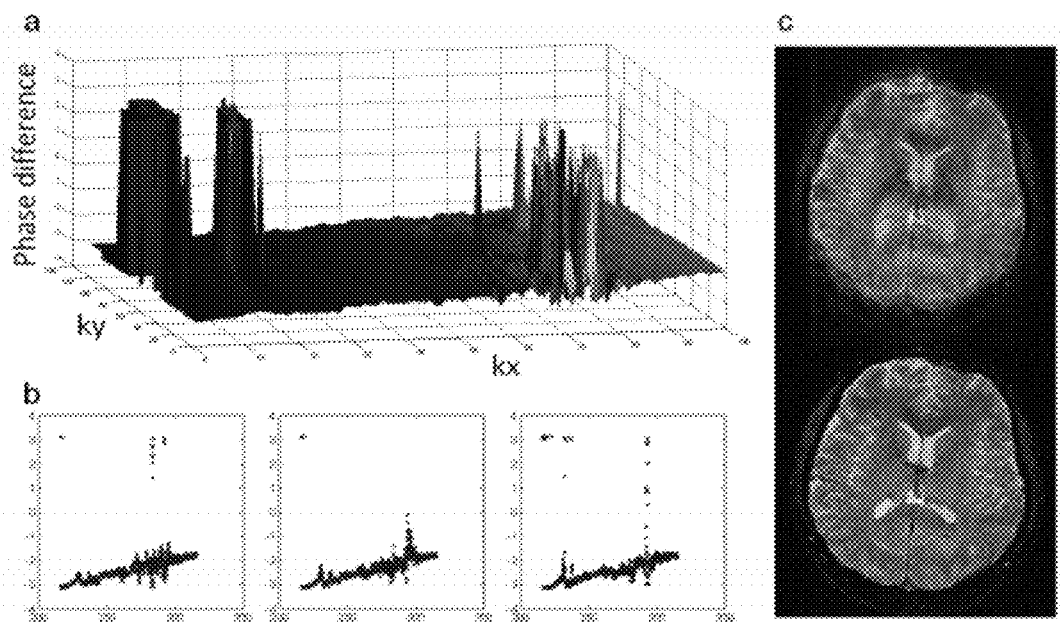
FIG. 13 are graphs and images depicting the procedure for 3D EPI ghost correction.

FIG. 13 illustrates graphs and images depicting the procedure for 3D EPI ghost correction. Particularly, FIG. 13a shows a navigator phase. The 2D phase difference between opposing readout polarities shows an approximately linear relationship as shown in FIG. 13a. In general, the phase map can be fitted with a linear or nonlinear function in 1D or multiple dimensions. Examples of linear phase fitting are shown in FIG. 13b. These fitted linear phase terms are used to correct the phase differences between odd and even k-space lines in 3D. FIG. 13c shows a comparison of uncorrected image and corrected image, which depicts a dramatic removal of ghost artifacts.

Figure 14:
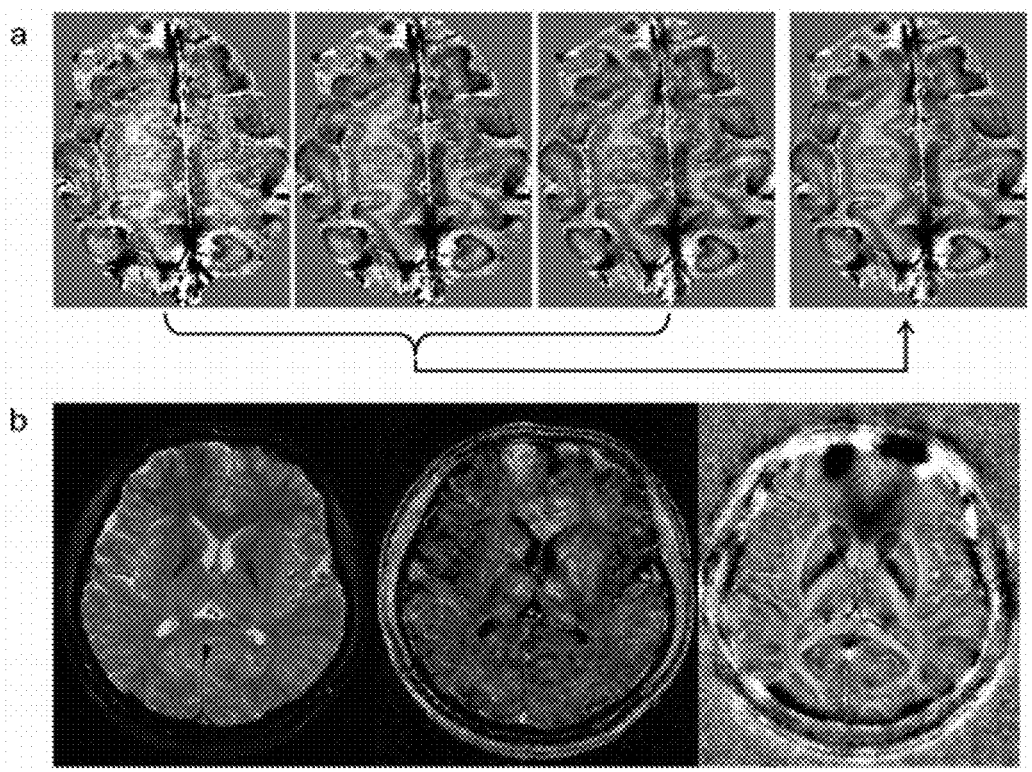
FIG. 14 are images showing improved SNR with multi-echo and multi-coil combination.

FIG. 14 illustrates images showing improved SNR with multi-echo and multi-coil combination. Particularly, FIG. 14a compares individual frequency images acquired at three different echoes with the combined frequency. Significant enhancement is gained with the multi-echo weighted averaging. FIG. 14b shows a representative slice of magnitude, R2* and frequency maps. The data were acquired on a 3T scanner with a 16-shot 3D EPI trajectory. The acquisition achieves 3D whole-brain coverage ($0.75 \times 0.75 \times 2$ mm$^3$) in 75 seconds.

Quantification of Brain Iron Stores

An example application of the subject matter disclosed herein involves imaging of brain tissue. Particularly, brain tissue contains a number of molecular compounds that can significantly affect the tissue susceptibility and the resultant resonance frequency shift, including nonheme iron, iron in deoxyhemoglobin, myelin, and proteins. In basal ganglia, the iron content is relative high and myelin content is relative low. Hence, the nonheme iron, especially that in the iron storage protein ferritin, may present a major source of magnetic susceptibility in these regions. Experiments show that the iron-enriched deep brain nuclei, including red nucleus, substantia nigra, globus pallitus, dentate nuclei, and the like exhibited strong paramagnetic shift comparing to CSF and the surrounding white matter. In addition to ferritin, changes in magnetic susceptibility due to accumulation of hemosidersin, degradation product of ferritin, can also reflect iron overload and hemorrhage. There has been great interest in mapping brain iron due to its value in the disease diagnosis and the understanding of disease pathogenesis. Alteration in iron content has been documented in many neurological diseases, such as Huntington's disease, Parkinson's disease, Alzheimer's disease, multiple sclerosis, chronic hemorrhage, traumatic brain injury, and the like. Previous studies have utilized the R2* map to evaluate the iron distribution inside the brain. However, R2* is not only affected by iron distribution, but may also be affected by other factors, such as water content and calcium. Alternatively, the susceptibility map may provide a more quantitative and physically meaningful index, thus warrants further application of susceptibility mapping for assessment of brain iron content in vivo.

Figure 15:
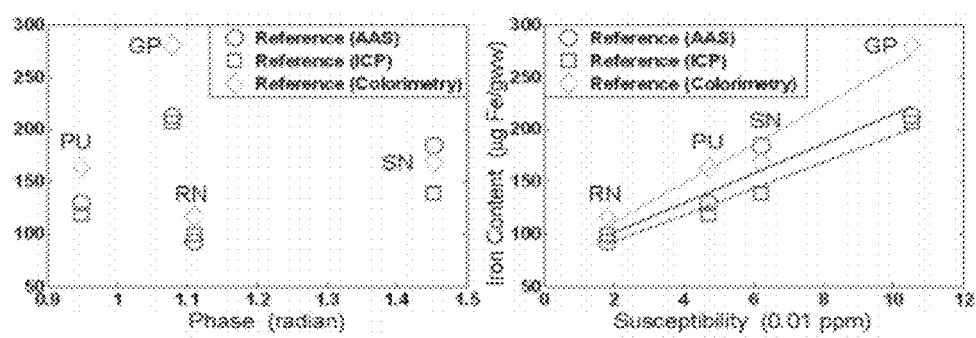
FIG. 15 are graphs showing that magnetic susceptibility correlates linearly with iron content in deep nuclei whereas phase does not.

FIG. 15 illustrates graphs showing that magnetic susceptibility correlates linearly with iron content in deep nuclei whereas phase does not. Text overlaying the images of FIG. 15 are defined as follows: RN—red nucleus; SN—substantia nigra; GP—globus pallitus; PU—putamen. Iron content was measured with three different methods: AAS, ICP, and colorimetry.

Quantification of Brain Myelination

Figure 16:
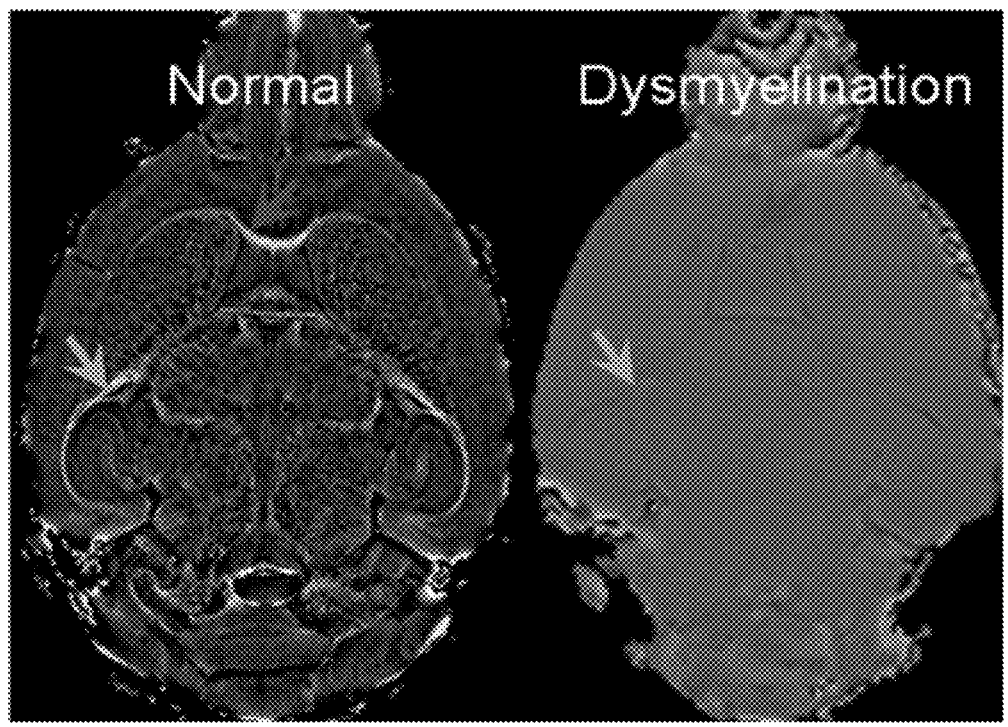
FIG. 16 are images showing that a loss of myelin in the shiverer mouse resulted in an extinction of susceptibility contrast.

The presently disclosed subject matter may also be applied for quantification of brain myelination. In contrast to deep nuclei, brain white matter has lower iron content, but high myelin content. As a result, myelin may present as a major factor that affects tissue susceptibility in white matter. Consistent with the diamagnetic property of myelin, white matter is more diamagnetic than gray matter. Evidently, the susceptibility map shows excellent contrast between gray and white matter. The importance of myelin in susceptibility contrast was supported by that dysmyelination in genetically manipulated shiverer mice can lead to an almost complete loss of phase and susceptibility contrast. FIG. 16 illustrates images showing that a loss of myelin in the shiverer mouse resulted in an extinction of susceptibility contrast. Demyelination is one of the most prominent phenotype of many neurological diseases, such as acute disseminated encephalomyelitis, transverse myelitis, chronic inflammatory demyelinating polyneuropathy, Guillain-Barré Syndrome, multiple sclerosis, and the like. Magnetic susceptibility contrast may provide a powerful tool for early disease diagnosis and for monitoring of medical treatment of these diseases.

Quantification of Calcification

Tissue calcification is generally evaluated with CT. In T2*-weighted MRI images, signal dropout due to the susceptibility of calcium ions cannot be distinguished from other susceptibility sources such as microbleeds. However, the susceptibility of calcium compounds is diamagnetic while microbleeds are paramagnetic. Thus, quantitative susceptibility could be used to quantify tissue calcification encountered, e.g. in arteries, kidney stones and breast cancers.

Figure 17:
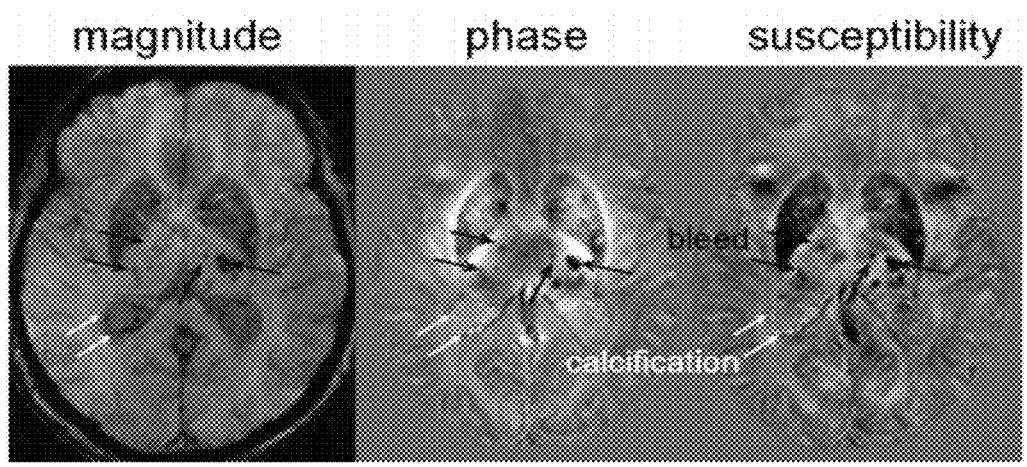
FIG. 17 are images showing detection and quantification of tissue calcification.

FIG. 17 illustrates images showing detection and quantification of tissue calcification. Calcium compounds exhibit diamagnetic susceptibility opposing the paramagnetic susceptibility of microbleeds.

The various techniques described herein may be implemented with hardware or software or, where appropriate, with a combination of both. Thus, the methods and apparatus of the disclosed embodiments, or certain aspects or portions thereof, may take the form of program code (i.e., instructions) embodied in tangible media, such as floppy diskettes, CD-ROMs, hard drives, or any other machine-readable storage medium, wherein, when the program code is loaded into and executed by a machine, such as a computer, the machine becomes an apparatus for practicing the presently disclosed subject matter. In the case of program code execution on programmable computers, the computer will generally include a processor, a storage medium readable by the processor (including volatile and non-volatile memory and/or storage elements), at least one input device and at least one output device. One or more programs may be implemented in a high level procedural or object oriented programming language to communicate with a computer system. However, the program(s) can be implemented in assembly or machine language, if desired. In any case, the language may be a compiled or interpreted language, and combined with hardware implementations.

The described methods and apparatus may also be embodied in the form of program code that is transmitted over some transmission medium, such as over electrical wiring or cabling, through fiber optics, or via any other form of transmission, wherein, when the program code is received and loaded into and executed by a machine, such as an EPROM, a gate array, a programmable logic device (PLD), a client computer, a video recorder or the like, the machine becomes an apparatus for practicing the presently disclosed subject matter. When implemented on a general-purpose processor, the program code combines with the processor to provide a unique apparatus that operates to perform the processing of the presently disclosed subject matter.

Features from one embodiment or aspect may be combined with features from any other embodiment or aspect in any appropriate combination. For example, any individual or collective features of method aspects or embodiments may be applied to apparatus, system, product, or component aspects of embodiments and vice versa.

While the embodiments have been described in connection with the various embodiments of the various figures, it is to be understood that other similar embodiments may be used or modifications and additions may be made to the described embodiment for performing the same function without deviating therefrom. Therefore, the disclosed embodiments should not be limited to any single embodiment, but rather should be construed in breadth and scope in accordance with the appended claims.

What is claimed:

1. A method for magnetic resonance imaging (MRI), the method comprising:
   using an MRI system to acquire a plurality of image echoes of an object at a plurality of echo times;
   combining the plurality of image echoes using a weighted averaging technique;
   generating an image of the object based on the combined image echoes for depicting a characteristic of the object; and applying a varying-radius spherical mean value (SMV) filtering technique to separate tissue phase from background phase; and wherein the radius of the sphere decreases towards the edges of the object, and wherein the filtering technique is conducted in a frequency domain.

2. The method of claim 1, wherein using the MRI system comprises using the MRI system to acquire the plurality of image echoes at a plurality of echo times and at a single orientation or a plurality of orientations of the object relative to a magnetic field generated by the MRI system.

3. The method of claim 1, wherein using the MRI system comprises using the MRI system to acquire the image echoes by one of spin wrap trajectory, interleaved spiral trajectory, and three-dimensional (3D) echo planar imaging (EPI) trajectory; and 3D echo planar imaging being corrected by use of a navigator phase.

4. The method of claim 1, wherein combining the image echoes comprises applying one of multi-echo averaging and multi-echo weighted averaging to the image echoes.

5. The method of claim 1, wherein generating the image of the object comprises generating an image of magnetic susceptibility based on the combined image echoes, and wherein the image echoes are acquired at a plurality of echo times.

6. The method of claim 5, wherein generating the image of magnetic susceptibility comprises:

generating a phase image based on the combined image echoes; and applying a Laplacian operator to the phase image to separate magnetic field originating from magnetic sources outside a field of view.

7. The method of claim 1, wherein generating the image comprises:

partitioning the frequency domain of the phase image into a trusted region and an ill-posed region; and one of:

applying a derivative and Fourier relationship to the combined image echoes; and applying a compressed sensing technique to estimate the underlying magnetic susceptibility values in the trusted region and the ill-posed region.

8. A magnetic resonance imaging (MRI) system comprising:

an MRI device configured to acquire a plurality of image echoes of an object at a plurality of echo times; and an image generator configured to:

combine the plurality of image echoes using a weighted averaging technique;

generate an image of the object based on the combined image echoes for depicting a characteristic of the object; and apply a varying-radius spherical mean value (SMV) filtering technique to separate tissue phase from background phase; and wherein the radius of the sphere decreases towards the edges of the object, and wherein the filtering technique is conducted in a frequency domain.

9. The MRI system of claim 8, wherein the MRI device is configured to acquire the plurality of image echoes at a plurality of echo times and at a single orientation or a plurality of orientations of the object relative to a magnetic field generated by the MRI system.

10. The MRI system of claim 8, wherein the MRI device is configured to acquire the plurality of image echoes by one of spin wrap trajectory, interleaved spiral trajectory, and three-dimensional (3D) echo planar imaging (EPI) trajectory; and 3D echo planar imaging being corrected by use of a navigator phase.

11. The MRI system of claim 8, wherein the image generator is configured to apply one of multi-echo averaging and multi-echo weighted averaging to the image echoes, and wherein the image echoes are acquired at a plurality of echo times.

12. The MRI system of claim 8, wherein the image generator is configured to generate an image of magnetic susceptibility based on the combined image echoes.

13. The MRI system of claim 12, wherein the image generator is configured to:

generate a phase image based on the combined image echoes; and apply a Laplacian operator to the phase image to separate magnetic field originating from magnetic sources outside a field of view.

14. The MRI system of claim 8, wherein the image generator is configured to:

partition the frequency domain of the phase image into a trusted region and an ill-posed region; and one of:

apply a derivative and Fourier relationship to the combined image echoes; and apply a compressed sensing technique to estimate the underlying magnetic susceptibility values in the trusted region and the ill-posed region.

* * * * *